(12) United States Patent
Lewis

(10) Patent No.: US 8,008,907 B2
(45) Date of Patent: Aug. 30, 2011

(54) DELAY LINE CALIBRATION CIRCUIT COMPRISING ASYNCHRONOUS ARBITER ELEMENT

(75) Inventor: Mike Lewis, Maersta (SE)

(73) Assignee: Infineon Technologies AG, Munich (DE)

( * ) Notice: Subject to any disclaimer, the term of this patent is extended or adjusted under 35 U.S.C. 154(b) by 97 days.

(21) Appl. No.: 11/546,888

(22) Filed: Oct. 12, 2006

(65) Prior Publication Data
US 2007/0182423 A1      Aug. 9, 2007

(30) Foreign Application Priority Data

Feb. 9, 2006   (EP) .................................... 06002663

(51) Int. Cl.
*G01R 23/175*   (2006.01)
(52) U.S. Cl. ..................................... 324/76.54
(58) Field of Classification Search ............... 324/76.54, 324/76.61, 676, 601
See application file for complete search history.

(56) References Cited

U.S. PATENT DOCUMENTS

| | | | | |
|---|---|---|---|---|
| 3,265,986 | A | | 8/1966 | Wyckoff |
| 5,034,967 | A | * | 7/1991 | Cox et al. ....................... 375/373 |
| 5,822,768 | A | * | 10/1998 | Shakkarwar ................... 711/149 |
| 6,390,579 | B1 | * | 5/2002 | Roylance et al. .................. 347/9 |
| 6,661,860 | B1 | * | 12/2003 | Gutnik et al. .................. 375/354 |
| 7,039,824 | B2 | * | 5/2006 | Simon et al. ................... 713/400 |
| 2002/0006178 | A1 | | 1/2002 | Takagi |
| 2002/0049936 | A1 | * | 4/2002 | Gutnik et al. .................. 714/700 |
| 2004/0120437 | A1 | | 6/2004 | Casper et al. |

OTHER PUBLICATIONS

Garside, J.D. et al. "AMULET3i—an Asynchronous System-on-Chip." IEEE Sixth International Symposium on Advanced Research on Asynchronous Circuits and Systems. IEEE Computer Society Press, 2000. pp. 162-175. (14 pages).
Molnar, Charles E. and Ian W. Jones. "Simple Circuit that Work for Complicated Reasons." IEEE Sixth International Symposium on Advanced Research on Asynchronous Circuits and Systems. Sun Microsystems Laboratories: Palo Alto, California, 2000. pp. 138-149. (12 pages).

* cited by examiner

*Primary Examiner* — Thomas Valone
(74) *Attorney, Agent, or Firm* — Maginot Moore & Beck

(57) ABSTRACT

A delay line calibration circuit is disclosed herein. The calibration circuit has an arbiter circuit having a unit for determining which of two signals that arrive first; a first and a second synchronous element each having an input for receiving a clock signal, and one of them having a unit for outputting the clock signal a clock period later; and a calibration circuit having inputs connected to the outputs of the arbiter circuit for receiving a signal from it indicative of whether the signal input to the arbiter circuit from the delay line is ahead or after the signal input to the arbiter circuit from the second element, the calibration circuit further being connected to the delay line for calibrating the delay line in accordance with the signal received from the arbiter circuit. The invention in at least one embodiment provides improved calibration of delay lines.

18 Claims, 2 Drawing Sheets

DELAY LINE CALIBRATION CIRCUIT COMPRISING ASYNCHRONOUS ARBITER ELEMENT

CROSS-REFERENCE TO RELATED APPLICATIONS

This application claims priority from European Patent Application No. 06002663.0, which was filed on Feb. 9, 2006, and is incorporated herein by reference in its entirety.

FIELD

The invention relates to a delay line calibration circuit for calibration of a delay line comprising delay elements. An application in which such circuit is usable is for example pulse-width modulator.

BACKGROUND

In a synchronous digital circuit, the clock signal provides the timing reference for all operations. In power-sensitive applications it is desirable to keep the switching frequency of this clock signal as low as possible in order to minimize current consumption. However, there are some applications in which a low clock frequency causes problems since a low clock frequency puts a limit on the timing resolution available within the circuit.

An example of such an application is a class-D digital modulator. A class-D digital modulator converts a sampled digital representation of a signal (e.g. audio) into a pulse train where the width of the pulses are controlled such that passing the pulse train through a low-pass filter will recreate the desired analog signal. One of the factors controlling how faithfully the analog signal can be recreated is how accurately the width of the pulses can be controlled. If the pulses are generated directly by logic driven by a low-frequency digital clock signal, the resolution of the pulse width modulator is fundamentally limited.

In a state of the art solution this problem is addressed by using a tapped delay line subsequent to the digital modulator, as is shown in FIG. 1. The delay is controlled by selecting an appropriate tap (in the figure $tap_1$, $tap_2$ or $tap_3$) so as to provide sub clock-cycle accuracy in the output of the PWM modulator (Pulse Width Modulator). The example of the prior art shown in FIG. 1 uses three delay elements $D_1$, $D_2$ and $D_3$ to provide an additional accuracy of 2 bits in the pulse width control.

The delay elements are typically implemented using a chain of standard logic gates, such as inverters. The delay through a logic gate is very much dependent on ambient temperature, voltage and variations in processing of the silicon, which means that it must be possible to adjust the delay elements. This is typically done by adjusting the number of logic gates in the signal path by means of multiplexers or, if finer control is required, by adjusting the drive strength of the logic gates in the signal path. The adjustment is performed by a calibration process, whereby the delay through the delay line is measured in order to calculate adjustment values "cal" for each delay stage.

In accordance with the state of the art, such as disclosed in J. D. Garside et al "Amulet3i—an Asynchronous System-on-chip", Proc. 6$^{th}$ International Symposium on Advanced Research in Asynchronous Circuits and Systems, April 2000, calibration of such a delay line is managed by connecting the delay line in a ring oscillator configuration, in which the output of the delay line is connected via an inverter to the input of the delay line. The oscillation so generated has a period that depends on the delay experienced by the positive and negative flanks of the signal. A large number of cycles of this oscillation are measured and compared with the number of cycles of the system clock, which elapse during the same period. It is necessary to perform the large number of cycles due to the inevitable synchronization between the two asynchronous clocks, which can introduce an error of up to half a clock period. During the time that this calibration is in process, the delay line cannot be used for its normal, intended function, which of course is disadvantageous. Alternatively, two delay lines could be used, using one for the intended function and the other for calibration purposes, and alternate between normal operation mode and calibration mode. However, it would then be necessary to bear the hardware cost of implementing two delay lines. This solution also requires more chip area.

Furthermore, two sources of systematic errors remain in such a measurement, which cannot be mitigated by longer measurement periods. Firstly, the period of oscillation depends on the delays experienced by both positive and negative-going flanks of the signal through the delay line, which delays typically are different. This limits the accuracy with which the calibration of either flank can be performed. Secondly, the additional circuitry and signal paths required for connecting the delay line in the ring oscillator configuration also increases the period of the oscillation, as well as the complexity of the circuit.

It would thus be desirable to be able to simplify and improve the calibration of delay lines.

SUMMARY

An advantage of an embodiment of at least one embodiment of the invention is to provide an improved calibration circuit enabling the calibration to be performed continuously and without the need to discontinue the use of the delay line in order to perform calibration, thereby at least alleviating the shortcomings of the prior art.

In accordance with at least one embodiment invention a delay line calibration circuit is provided. The delay line calibration circuit comprises an arbiter circuit connected to a delay line, which arbiter circuit has at least two inputs for receiving two signals. The arbiter circuit comprises means for determining which one of two signals arrives first. The delay line calibration circuit further comprises first and second synchronous elements, each comprising an input for receiving a clock signal and a signal synchronous to the clock signal. The first element comprises an output connected to the delay line, while the second element comprises an output connected to one of the two inputs of the arbiter circuit and means for outputting the signal output to the delay line a clock period later. The calibration circuit is connected to the arbiter circuit for receiving a signal from it, the signal being indicative of whether the signal input to the arbiter circuit from the delay line is ahead or after the signal input to the arbiter circuit from the second element. The calibration circuit is further connected to the delay line for calibrating the delay line in accordance with the signal received from the arbiter circuit.

By means of at least one embodiment of the invention a very accurate calibration of a delay line is provided, enabling the use of a single circuit. This of course provides a more cost-efficient circuit requiring less hardware and less chip area. There is no need to take the delay line out of its normal operation and thereby the requirement of double delay lines is also eliminated. Further, in the calibration circuit in accordance with at least one embodiment of the invention the calibration is performed continuously, whereby for example variations in temperature or supply voltage affect the calibration performance less than if a calibration over a long period is performed.

In accordance with at least one embodiment of the invention the arbiter circuit comprises a NAND arbiter for handling a rising edge of a clock signal. In another embodiment the arbiter circuit comprises a NOR arbiter for handling a falling edge of a clock signal. The calibration circuit can comprise either one of the arbiter elements or both, depending on the intended use and application. A most flexible circuit is thereby provided able to separately calibrate the delay for both rising edges and falling edges of a clock signal.

In accordance with another embodiment of the invention the calibration circuit is connected to each of several delay elements of the delay line for calibrating the delay line. The calibration circuit can further have storage means for storing different delay calibration parameter values and handles the algorithm for updating these values. The calibration values used can thus easily be changed.

The present invention in at least one embodiment also relates to a modulator device comprising such calibration circuit, whereby advantages corresponding to the above are obtained.

BRIEF DESCRIPTION OF THE DRAWINGS

Preferred embodiments of the present invention will be explained in detail in the following with reference to the accompanying drawings, in which.

DETAILED DESCRIPTION

In at least one embodiment, the present invention provides a circuit and modulator device for separately calibrating the delay for positive and negative going flanks of a clock pulse, without the need to take a delay line out of its normal operation and with a potentially very low systematic error. The present method is based on the properties of the asynchronous arbiter element, which is an application of the S-R (set-reset) flip-flop allowing the order of arrival of two signals to be determined with a precision of less than 1 picosecond, as is described in the publication C. E. Molnar, I. W. Jones "Simple circuits that work for complicated reasons", Proc. $6^{th}$ International Symposium on Advanced Research in Asynchronous Circuits and Systems, April 2000.

Figure 2A:
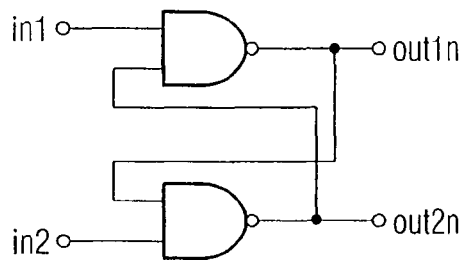
FIGS. 2a and 2b illustrate two mutual exclusion elements.
Figure 2B:
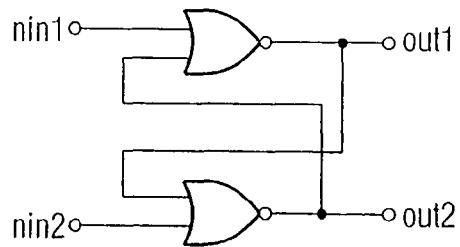

There are two variants of this circuit, as illustrated in FIGS. 2a and 2b, which variants differ in the edge direction of the input signals (high-to-low or low-to-high flank) that they detect. The circuit based around NAND gates (FIG. 2a) detect the order of arrival of low-high transitions on the input signals. Initially inputs in1 and in2 are low and outputs out1n and out2n are high. If in1 goes high before in2, then the output out1n will go low. Likewise, if in2 goes high before in1, then the output out2n will go low. If in1 and in2 transition from low to high at nearly the same time, then the circuit will enter a metastable state, in which both the outputs attempt to go low. If the device is laid out symmetrically, with care paid to matching between the transistors in the two logic gates, then the input that arrived first will gain a slight advantage and the metastability will resolve so that the associated output goes low. The NOR arbiter (FIG. 2b) works in a similar manner, but with active low inputs and active high outputs.

Figure 3:
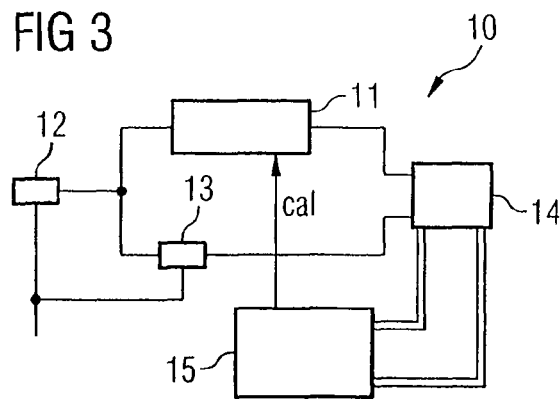
FIG. 3 illustrates a block diagram of an embodiment of the present invention.

An embodiment of the inventive concept will now be described with reference first to FIG. 3, which illustrates schematically the core idea of the delay line calibration circuit 10 in accordance with at least one embodiment of the invention. The delay line calibration circuit 10 comprises a delay line 11, which is shown very schematically. It is understood that the delay line 11 preferably comprises conventional delay elements and corresponding tap outputs (not shown). The total delay of the delay line 11 should be exactly equal to one clock period, that is, if the circuit is perfectly calibrated, the delay line 11 delays the signal a whole cycle and the output is thus synchronised with the clock cycle. Two synchronous elements 12, 13, such as flip-flops or the like, are also included for providing synchronised input clock signals; that is, the second element 13 provides an identical copy of the signal exactly one clock cycle later. The delay line calibration circuit 10 further comprises an arbiter circuit 14 for determining which of two received signals arrive first. This arbiter circuit 14 comprises one or more of the arbiter elements described with reference to FIGS. 2a and 2b, i.e. one or more NAND arbiter and/or one or more NOR arbiter. Lastly, the delay line calibration circuit 10 comprises a calibration logic control unit 15 receiving inputs from the arbiter circuit 14, and based on this input the calibration logic control unit 15 determines how to calibrate the delay line 11.

Figure 4:
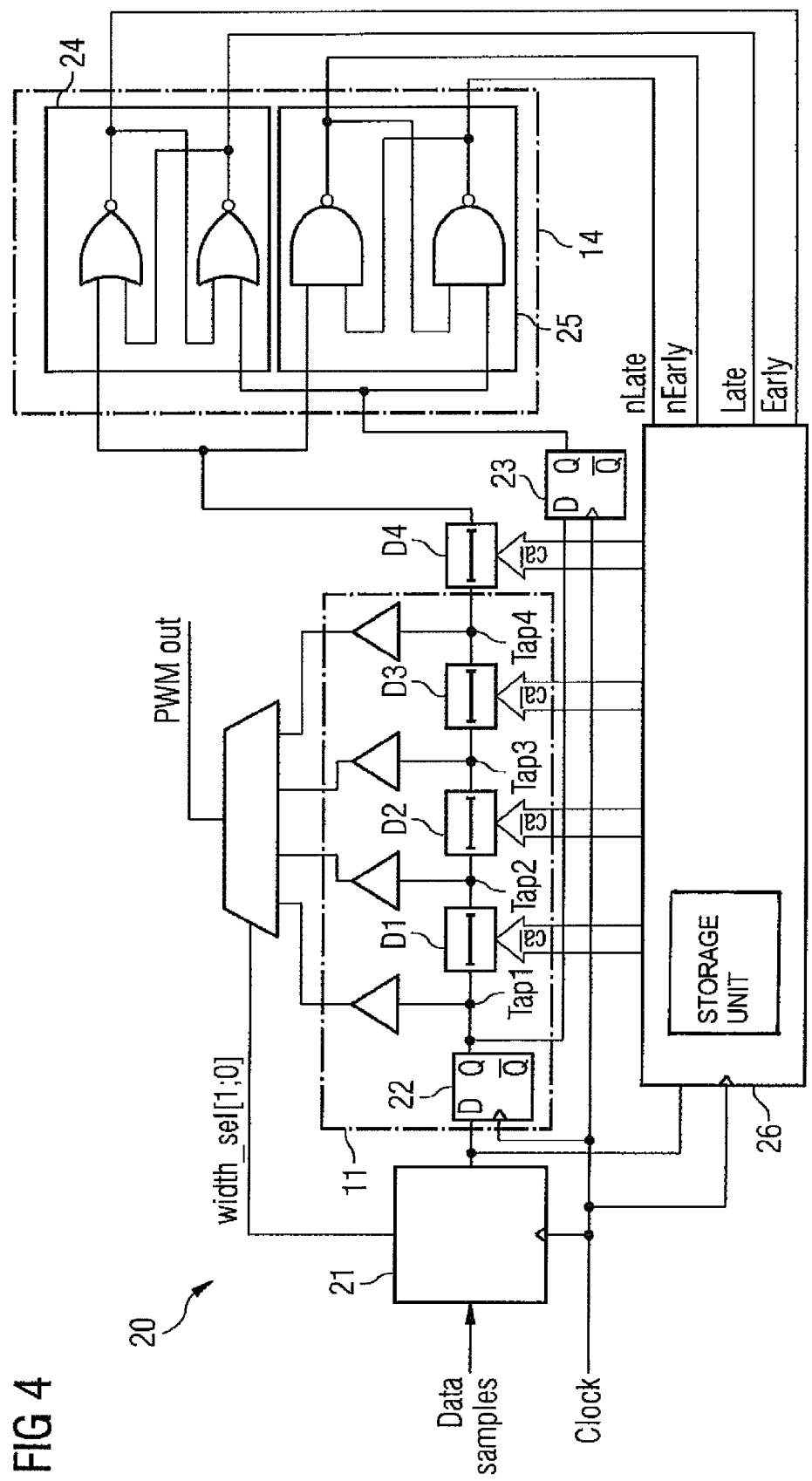
FIG. 4 illustrates a modulator in which the present invention can be used.

The inventive calibration circuit 10 can, for example, be used in a pulse-width modulator device, which will be described next with reference to FIG. 4. It is understood that the calibration circuit 10 may be utilised in other applications as well in order to calibrate a delay line. A pulse-width modulator device 20 comprises a pulse-width modulator 21 taking data samples as one input signal and a clock signal as another input signal. The output from the pulse-width modulator 21 is a pulse-width modulated signal, the pulse-width of which is controlled by means of a delay line 11 in order to obtain a higher accuracy of the signal output from the pulse-width modulator device 20, and thereby providing a higher resolution of the modulator.

Figure 1:
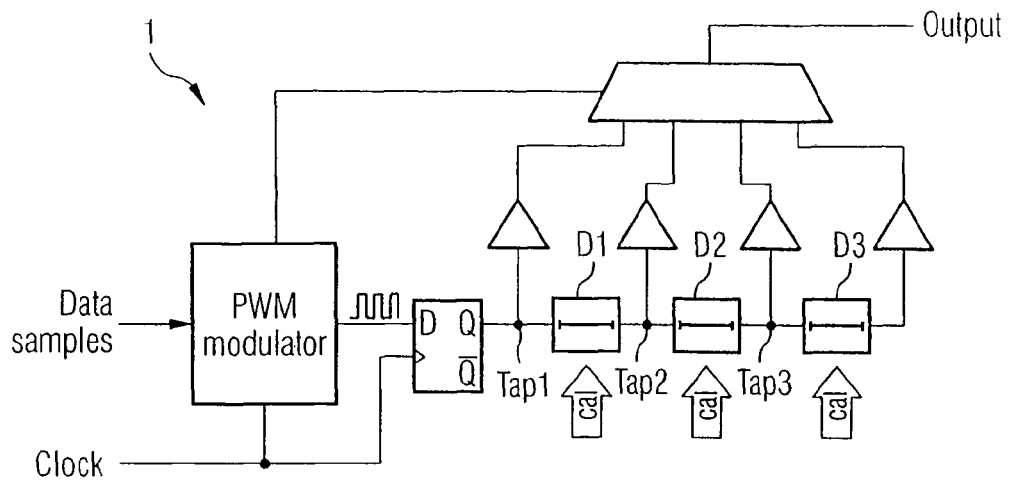
FIG. 1 illustrates a prior art pulse-width modulator using tapped delay line.

Compared to the prior art pulse-width modulator 1 illustrated in FIG. 1, an additional delay element $D_4$ is added to the delay line 11 of the pulse-width modulator device 20, in addition to delay elements $D_1$, $D_2$ and $D_3$. This means that the total delay through all of the delay elements $D_1$, $D_2$, $D_3$ and $D_4$ should, when calibration is performed correctly, be exactly equal to one clock cycle, that is, if the delay line 11 is tapped at the fourth delay tap output, $tap_4$, then the total delay should be equal to one clock cycle. If this holds and the calibration values for each delay stage are approximately equal, then the delay to each of the taps $tap_1$, $tap_2$, $tap_3$ and $tap_4$ should be substantially equal to evenly spaced fractions of one clock cycle.

As was described in the introductory part, the delay through a logic gate is highly dependent on for example the operating temperature and the delay elements $D_1$, $D_2$, $D_3$ and $D_4$ therefore need to be adjusted or calibrated. A digital calibration logic control unit 26 is therefore provided and stores the appropriate delay calibration values and also comprises means for managing an algorithm for updating these values. The calibration values for each respective delay stage do not need to be equal, i.e. the amount of delay between the various taps can be different, and the calibration values can thus be set in accordance with specific requirements. However, for the case of a pulse-width modulator it is advantageous that the calibration values and hence the corresponding delays are substantially equal. The calibration logic control unit 26 is connected to an arbiter circuit 14 comprising arbiter elements 24, 25, which were described earlier.

The pulse-width modulator device 20 in accordance with at least one embodiment of the invention is capable of calibrating the delay for both a rising edge and a falling edge. The calibration of the delay for a rising edge is performed via a NAND arbiter 25, and the calibration of the delay for a falling edge is performed via a NOR arbiter 24. If calibration is required for only one edge, which for example can be the case if the other edge is always generated directly from a clocked latch, then only one of the arbiter elements 24, 25 and relevant parts of the calibration algorithm need to be used, and the other can be left out.

When a rising edge is to be fed through the delay line, then the calibration values setting the delay for the positive-going edges are applied to the delay line by the calibration logic 26. From the active clock edge, the positive-going edge passes from the D-Q flip-flop 22 and moves along the delay line 11. An additional D-Q flip-flop 23 generates an identical copy of the positive-going edge exactly one clock cycle later. If the delay through the delay line 11 is too small, then a signal nEarly from the NAND arbiter 25 will go low and the calibration values should be updated to increase the delay through the delay line 11, in such a way that the delays through each delay element $D_1$, $D_2$, $D_3$ and $D_4$ are as near to identical as possible. If on the other hand the delay through the delay line 11 is too large, then a signal nLate will go low and the calibration values should again be updated, but now to decrease the delay through the delay line 11 in a corresponding way.

Negative edges are handled in a similar manner: prior to the negative-going edge being fed into the delay line, the calibration values for negative-going edges are applied by the calibration logic 26 and this time the signals Early and Late from the NOR arbiter 24 are used to determine the order of arrival and calibration parameter values setting the delay for the negative-going edges are applied to the delay line 11 by the calibration logic control unit 26.

As long as care is taken in matching the layout of the delay stages, in matching the fan-out loads at each point and in balancing the clock paths, it should be possible to reduce the error in measurement to a very low value. The rate of calibration is limited only by the statistical spread of times required for metastability in the arbiter elements to resolve, which in practice is very much faster than the pulse repetition rates for e.g. audio PWM systems.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A delay line calibration circuit for controlling the delay of a delay line, the delay line calibration circuit comprising:
   an arbiter circuit comprising at least two inputs for receiving two signals, a unit configured to determine which of said two signals arrive first, and outputs, wherein a first of said at least two inputs is connected to an output of said delay line;
   a first D-Q flip-flop with a first input for receiving a first signal, a second input for receiving a clock signal and an output connected to an input of said delay line, for providing said first signal synchronized with the clock signal,
   a second D-Q flip-flop with a first input connected to an output of said first D-Q flip-flop, a second input for receiving the clock signal and an output connected to a second input of said two inputs of said arbiter circuit, for providing a second signal synchronized with the clock signal, the second D-Q flip-flop generating a copy of the first signal synchronized with the clock signal exactly one clock cycle later, and
   a calibration circuit comprising inputs connected to the outputs of said arbiter circuit and configured to receive a signal from said arbiter circuit indicative of whether the signal input to the arbiter circuit from the delay line is ahead or after the signal input to the arbiter circuit from the second D-Q flip-flop, said calibration circuit having an output connected to said delay line and configured to calibrate the delay of the delay line in accordance with the signal received from the arbiter circuit.

2. The circuit of claim 1 wherein said arbiter circuit comprises a NAND arbiter for handling a rising edge of the clock signal.

3. The circuit of claim 1 wherein the arbiter circuit comprises a NOR arbiter for handling a falling edge of the clock signal.

4. The circuit of claim 1 wherein the output of the calibration circuit is connected to delay elements of said delay line, the calibration circuit being configured to calibrate a delay of the delay elements based on the signal received from the arbiter circuit.

5. The circuit of claim 4 wherein said calibration circuit comprises a storage unit for storing delay calibration parameter values.

6. The circuit of claim 5 wherein said calibration circuit further comprises a unit for executing an updating algorithm for updating said calibration parameter values.

7. A modulator device comprising:
   a pulse-width modulator;
   a delay line calibration circuit configured to control the delay of a delay line comprising delay elements such that the delay of the delay line in its perfectly calibrated state is equal to one clock period of a clock signal, wherein said delay line calibration circuit comprises
   an arbiter circuit comprising at least two inputs for receiving two signals, a unit configured to determine which of said two signals arrive first, and outputs, wherein a first of said at least two inputs is connected to an output of said delay line;
   a first D-Q flip-flop with a first input for receiving a first signal, a second input for receiving a clock signal and an output connected to an input of said delay line, for providing said first signal synchronized with a clock signal,
   a second D-Q flip-flop with an input connected to an output of said first D-Q flip-flop, a second input for receiving the clock signal and an output connected to a second input of said two inputs of said arbiter circuit, for providing a second signal synchronized with said clock signal, the second D-Q flip-flop generating a copy of the first signal synchronized with the clock signal exactly one clock cycle later, and
   a calibration circuit comprising inputs connected to the outputs of said arbiter circuit and configured to receive a signal from said arbiter circuit indicative of whether the signal input to the arbiter circuit from the delay line is ahead or after the signal input to the arbiter circuit from the second D-Q flip-flop, said calibration circuit having an output connected to said delay line and configured to calibrate the delay of the delay line in accordance with the signal received from the arbiter circuit.

8. The modulator device of claim 7 wherein the pulse-width modulator is connected to said first and second D-Q flip-flops of said delay line calibration circuit.

9. The modulator device of claim 7 wherein said arbiter circuit comprises a NAND arbiter for handling a rising edge of the clock signal.

10. The modulator device of claim 7 wherein the arbiter circuit comprises a NOR arbiter for handling a falling edge of the clock signal.

11. The modulator device of claim 7 wherein the calibration circuit is connected to delay elements of said delay line.

12. The modulator device of claim 7 wherein said calibration circuit comprises a storage unit for storing delay calibration parameter values.

13. The modulator device of claim 12 wherein said calibration circuit further comprises a unit for executing an updating algorithm for updating said calibration parameter Values.

14. A delay line calibration circuit configured to control the delay of a delay line comprising delay elements such that the delay of the delay line in its perfectly calibrated state is equal to one clock period of a clock signal, wherein said delay line calibration circuit comprises:

an arbiter circuit comprising at least two inputs for receiving two signals, a unit configured to determine which of said two signals arrive first, and outputs, wherein a first of said at least two inputs is connected to an output of said delay line;

a first D-Q flip-flop with an input for receiving a first signal and an output connected to an input of said delay line, for providing said first signal synchronized with a clock signal, a second D-Q flip-flop with an input connected to an output of said first D-Q flip-flop, a second input for receiving the clock signal and an output connected to a second input of said two inputs of said arbiter circuit, for providing a second signal synchronized with said clock signal, the second D-Q flip-flop generating a copy of the first signal synchronized with the clock signal exactly one clock cycle later, and a calibration circuit comprising inputs connected to the outputs of said arbiter circuit and configured to receive a signal from said arbiter circuit indicative of whether the signal input to the arbiter circuit from the delay line is ahead or after the signal input to the arbiter circuit from the second D-Q flip-flop, said calibration circuit having an output connected to said delay line and configured to calibrate the delay of the delay line in accordance with the signal received from the arbiter circuit.

15. The circuit of claim 14 wherein said arbiter circuit comprises a NAND arbiter for handling a rising edge of the clock signal.

16. The circuit of claim 14 wherein the arbiter circuit comprises a NOR arbiter for handling a falling edge of a clock signal.

17. The circuit of claim 14 wherein the calibration circuit is connected to delay elements of said delay line.

18. The circuit of claim 14 wherein said calibration circuit comprises a storage unit for storing delay calibration parameter values.

* * * * *